(12) United States Patent
Miyamoto et al.

(10) Patent No.: US 7,068,520 B2
(45) Date of Patent: Jun. 27, 2006

(54) CIRCUIT BOARD MADE OF RESIN WITH PIN

(75) Inventors: Noritaka Miyamoto, Komaki (JP); Kazuhisa Sato, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 260 days.

(21) Appl. No.: 10/665,405

(22) Filed: Sep. 22, 2003

(65) Prior Publication Data

US 2004/0129454 A1 Jul. 8, 2004

(30) Foreign Application Priority Data

Sep. 20, 2002 (JP) .......................... P.2002-275861

(51) Int. Cl.
*H01R 9/10* (2006.01)
(52) U.S. Cl. ...................... 361/774; 361/772; 361/773; 174/267
(58) Field of Classification Search ........ 361/770–774; 174/259–262, 266–268; 228/180.2, 160.2; 29/837–840; 257/707–710
See application file for complete search history.

(56) References Cited

U.S. PATENT DOCUMENTS

| 4,736,276 A | * | 4/1988 | Ushifusa et al. ............ 361/792 |
| 5,290,970 A | * | 3/1994 | Currie ........................ 174/250 |
| 5,640,052 A | * | 6/1997 | Tsukamoto ................. 257/781 |
| 5,926,375 A | * | 7/1999 | Watanabe et al. ........... 361/760 |
| 6,054,652 A | * | 4/2000 | Moriizumi et al. ......... 174/261 |
| 6,229,207 B1 | | 5/2001 | Master |
| 6,359,332 B1 | * | 3/2002 | Shiraishi ..................... 257/697 |
| 6,376,782 B1 | * | 4/2002 | Kimura et al. .............. 174/267 |
| 6,413,849 B1 | | 7/2002 | Yeoh et al. |
| 6,448,106 B1 | * | 9/2002 | Wang et al. ................. 438/106 |
| 6,518,518 B1 | * | 2/2003 | Saiki et al. .................. 174/267 |
| 6,555,757 B1 | * | 4/2003 | Saiki et al. .................. 174/256 |
| 6,583,366 B1 | * | 6/2003 | Saiki .......................... 174/267 |

FOREIGN PATENT DOCUMENTS

| JP | 2000-223184 | 8/2000 |
| JP | 2001-217341 | 8/2001 |
| JP | 2001-267451 | 9/2001 |
| JP | 2001-358277 | 12/2001 |

* cited by examiner

*Primary Examiner*—Kamand Cuneo
*Assistant Examiner*—Tuan Dinh
(74) *Attorney, Agent, or Firm*—Sughrue Mion, PLLC

(57) ABSTRACT

In a flat pin to be used in a circuit board made of resin with pins comprising a rod portion having a diameter of not greater than 0.35 mm and a concentric tabular large diameter portion having a larger diameter than that of the rod portion formed on one end of the rod portion, the ratio (W/S) of the diameter of the large diameter portion to the rod portion is from not smaller than 2.16 to not greater than 2.67 and the ratio (T/S) of the thickness of the large diameter portion to the diameter of the rod portion is from not smaller than 0.40 to not greater than 0.67 supposing that the diameter of the rod portion and the large diameter portion of the flat pin are S and W, respectively, and the thickness of the large diameter portion is T.

5 Claims, 7 Drawing Sheets

CIRCUIT BOARD MADE OF RESIN WITH PIN

BACKGROUND OF THE INVENTION

The present invention relates to a circuit board made of resin with pins and more particularly to a circuit board made of resin with pins comprising interlaminar insulating layers formed by a resin material and pins (input and output terminals) soldered thereto on a number of pin bonding portions (electrodes) formed on the main surface of the circuit board as in a PGA (pin grid array) type package circuit board having electronic parts such as semiconductor integrated circuit element (IC) mounted and encapsulated thereon.

A PGA type circuit board made of resin (hereinafter simply referred to as "board") has a number of pad-shaped pin bonding portions (electrodes) provided on one main surface thereof for mounting electronic parts such as LSI and IC chip and a number of pins provided on the other main surface thereof for inserting in sockets provided on mother board, etc. As such a pin there is normally used, e.g., nail-shaped flat pin comprising a rod portion and a tabular large diameter portion (having a greater diameter than the rod portion) formed on one end thereof. This flat pin is bonded to the circuit board with a solder layer formed by soldering with its large diameter portion disposed opposed to the pin bonding portion of the board.

In the aforementioned type of circuit board made of resin with pins, a tendency is given that more circuit boards made of resin have smaller size and more connecting terminals (pins) to attain higher integration and density of electronic parts such as LSI, IC chip and chip capacitor to be mounted. Therefore, the size of even the flat pin mounted on such a circuit board made of resin is reduced by reducing the diameter of the rod portion thereof.

[Patent Reference 1]
   JP-A-2001-267451
[Patent Reference 2]
   JP-A-2001-217341
[Patent Reference 3]
   JP-A-2001-358277

Referring to the reduction of size of flat pins provided on the aforementioned circuit board made of resin with pins, it is recently numerically required that the diameter of the rod portion be about 0.30 mm, particularly not greater than 0.35 mm (e.g., from not smaller than 0.25 mm to not greater than 0.35 mm). In the case where the diameter of the rod portion of the flat pin is reduced, it is necessary that the size of the large diameter portion of the flat pin be optimized depending on the diameter of the rod portion thus reduced. When this optimization is not made, a sufficient bonding strength of the large diameter portion of the flat pin with the pin bonding portion on the circuit board made of resin with pins cannot be secured. For example, when an excessive unexpected external force occurs in the axial direction or direction oblique thereto during the insertion of the pins in the sockets on the mother board, exfoliation can occur in the vicinity of the border of the solder layer for bonding the flat pin with the pin bonding portion or the border of the large diameter portion of the flat pin with the solder layer. This naturally makes it impossible for the circuit board made of resin with pins to maintain its quality requirements such as electrical characteristics.

SUMMARY OF THE INVENTION

The invention is worked out in the light of the aforementioned problems. An aim of the invention is to provide a circuit board made of resin with pins having flat pins soldered to the circuit board made of resin on the pin bonding portion which allows the confirmation of reliability in connection of the flat pin to the pin bonding portion while making suitable for the reduction of the size of the flat pin.

The circuit board made of resin with pins of the invention for solving the aforementioned problems is a circuit board made of resin with pins comprising flat pins each comprising a rod portion having a diameter of not greater than 0.35 mm and a concentric tabular large diameter portion having a larger diameter than that of the rod portion formed on one end of the rod portion, the flat pins each being soldered to a pin bonding portion provided on the main surface of a board at the large diameter portion, wherein the ratio (W/S) of the diameter of the large diameter portion to the rod portion is from not smaller than 2.16 to not greater than 2.67 supposing that the diameter of the rod portion and the large diameter portion of the flat pin are S and W, respectively.

The pins to be used on the aforementioned circuit board made of resin with pins of the invention each are a so-called pin comprising a rod portion and a concentric tabular large diameter portion having a larger diameter than that of the rod portion formed on one end of the rod portion. The diameter of the rod portion is predetermined to be not greater than 0.35 mm (e.g., from not smaller than 0.25 mm to not greater than 0.35 mm) to cope with the enhancement of integration and density of electronic parts such as LSI and IC chip to be mounted on the circuit board made of resin with pins. In the case where the diameter of the rod portion of the flat pin is thus reduced, it is necessary that the size of the large diameter portion be optimized to secure sufficient bonding strength of the ping bonding portion provided on the main surface of the board with the large diameter portion of the flat pin. To this end, it is predetermined in the invention that the ratio (W/S) of the diameter of the large diameter portion to the rod portion be from not smaller than 2.16 to not greater than 2.67 supposing that the diameter of the rod portion and the large diameter portion of the flat pin are S and W, respectively. When the ratio (W/S) falls below 2.16, the large diameter portion cannot play a role as a foundation, making it impossible for the flat pin to keep a sufficient bonding strength against a horizontal external force supposing that the axial direction of the flat pin is vertical. Further, the area of the large diameter portion bonded to the solder layer formed by soldering is reduced, making it impossible for the flat pin to keep a sufficient bonding strength also against an upward vertical external force. On the contrary, when the ratio (W/S) exceeds 2.67, it is more excessive for the diameter of the rod portion than required. This is as if excessive bonding strength is demanded. In other words, a sufficient bonding strength can be secured so far as the ratio (W/S) is limited to 2.67 at maximum. When the ratio (W/S) exceeds 2.67, it is also disadvantageous in that the resulting increase of the formed volume of the large diameter portion adds to cost.

The circuit board made of resin with pins of the invention is also characterized in that the ratio (T/S) of the thickness of the large diameter portion to the diameter of the rod portion is from not smaller than 0.40 to not greater than 0.67 supposing that the thickness of the large diameter portion is T. As mentioned above, the optimization of the diameter of the large diameter portion of the flat pin makes it possible to secure significantly the bonding strength of the flat pin with the pin bonding portion while making suitable for the reduction of the size of the flat pin. It is further preferred that the thickness of the large diameter portion of the flat pin be optimized. To this end, it is predetermined in the invention that the ratio (T/S) of the thickness of the large diameter portion to the diameter of the rod portion be from not smaller than 0.40 to not greater than 0.67. When the ratio (T/S) falls below 0.40, the thickness of the large diameter portion is too small, making it likely that the large diameter portion cannot act as a foundation. In other words, the large diameter portion cannot keep a strength great enough to support the rod portion, making the pin breakable. The breakableness of the pin relative to the thickness is defined as foundation strength which will be further described below. Let us suppose that a horizontal external force (supposing that the axial direction of the pin is vertical) is applied to the forward end of the rod portion of the pin. The stress on the pin produced by the external force occurs concentratedly in the vicinity of the border of the rod portion with the large diameter portion of the pin. The magnitude of the stress corresponds (proportionally) to the length between the portion at which the stress occurs and the forward end of the pin. Therefore, in the case where the total length is fixed, the greater the length between the portion at which the stress occurs and the forward end of the pin is, i.e., the smaller the thickness of the large diameter portion is, the greater is the stress applied to the portion in the vicinity of the border of the rod portion with the large diameter portion. Since the external force applied to the rod portion of the pin is not limited to horizontal external force or external force applied to the forward end of the pin and all the external forces applied to the rod portion of the pin can be treated as horizontal external force applied to the forward end of the pin, the aforementioned description can be applied to all the external forces applied to the rod portion of the pin. For the aforementioned reason, the smaller the thickness of the large diameter portion is, the more easily can break the pin due to stress.

On the contrary, when the ratio (T/S) exceeds 0.67, the aforementioned foundation strength is demanded more than required. It is thus considered satisfactory if the ratio (T/S) be limited to 0.67 at maximum. Further, when the ratio (T/S) exceeds 0.67, it is also disadvantageous in that the resulting increase of the volume of the large diameter portion adds to cost.

The invention is further characterized in that the ratio (W/S) of the diameter of the large diameter portion to the rod portion is from not smaller than 2.33 to not greater than 2.67 and the ratio (T/S) of the thickness of the large diameter portion to the diameter of the rod portion is from not smaller than 0.40 to not greater than 0.54. The aforementioned optimization of the diameter or the thickness of the large diameter portion of the flat pin is intended to secure sufficient bonding strength of the flat pin with the pin bonding portion and sufficient foundation strength. However, in the case where an excessive unexpected external force is applied to the flat pin even if sufficient bonding strength and foundation strength are secured, it can be supposed that the circuit board made of resin with pins is damaged starting with the flat pin. Forms of damage can be roughly divided into three forms. The first form of damage is break of the pin alone as shown in FIG. 6A. The second form of damage is exfoliation that occurs in the vicinity of the border of the large diameter portion of the pin with the solder layer as shown in FIG. 6B. The third form of damage is exfoliation that occurs in the vicinity of the border of the solder layer for bonding the pin with the pin bonding portion as shown in FIG. 6C. As compared with the second and third forms of damage, the first form of damage involves damage of the pin alone but the board and the solder layer. Accordingly, if any, damage preferably involves break of the pin alone.

In order to cause only the pin to be broken when given an external force, it is preferred that the ratio of the diameter of the large diameter portion to the rod portion (W/S) be as great as possible (from 2.33 to 2.67) within the above defined range (from 2.16 to 2.67) and the ratio of the thickness of the large diameter portion to the diameter of the rod portion (T/S) be as small as possible (from 0.40 to 0.54) within the above defined range (from 0.40 to 0.67). The reason why the ratio of the diameter of the large diameter portion to the rod portion (W/S) is required to be limited to such a high range is that the ratio (W/S) has something to do with the bonding strength as mentioned above and when the ratio (W/S) is small, that is, the resulting bonding strength is reduced, exfoliation occurs in the vicinity of the border of the pin having a reduced bonding strength with the solder or the border of the solder with the pin bonding portion prior to damage of the pin upon the application of an external force, raising the possibility of damage of the board and the solder layer. The reason why the ratio of the thickness of the large diameter portion to the diameter of the rod portion (T/S) is required to be limited to such a low range is that the ratio (T/S) has something to do with the foundation strength as mentioned above and when the ratio (T/S) is great, that is, the resulting foundation strength is raised, the pin can be difficultly broken upon the application of an external force because the large diameter portion has a great strength, causing the external force to move to the region in the vicinity of the border of the pin with the solder or the border of the solder with the pin bonding portion and hence the occurrence of exfoliation on these borders and resulting in the rise of the possibility of damage of the board and the solder layer.

The formed thickness of the solder layer formed on the basis of soldering is adjusted to be not greater than 0.30 mm along the vertical direction from the first main surface of the pin bonding portion toward the flat pin. In the case where the thickness of the solder layer exceeds 0.30 mm, when the pins of the circuit board having IC's mounted and encapsulated thereon as semiconductor device are inserted in the socket of a mother board, the solder can be brought into contact with the socket, making it difficult for the semiconductor device to set on the circuit board. The lower limit of the thickness of the solder layer may be predetermined to be e.g., about 0.10 mm, though not specifically limited.

In the circuit board made of resin with pins of the invention, the aforementioned flat pin is made of a metal containing at least copper. Copper has an excellent electrical conductivity and thus is preferably used as a material of flat pin. Copper is also soft and can deform when given a stress and thus is advantageous in that the resulting pin can be difficultly broken. Copper in the form of simple body forms a pin which is too soft and thus cannot be provided with a sufficient strength. Therefore, it is more desirable that a copper alloy containing a small amount of a metal such as iron (e.g., Alloy 194 (CDA Alloy C19400 (conforming to ASTM B465)) be used.

DETAILED DESCRIPTION OF THE PREFERRED EMBODIMENTS

Figure 1:
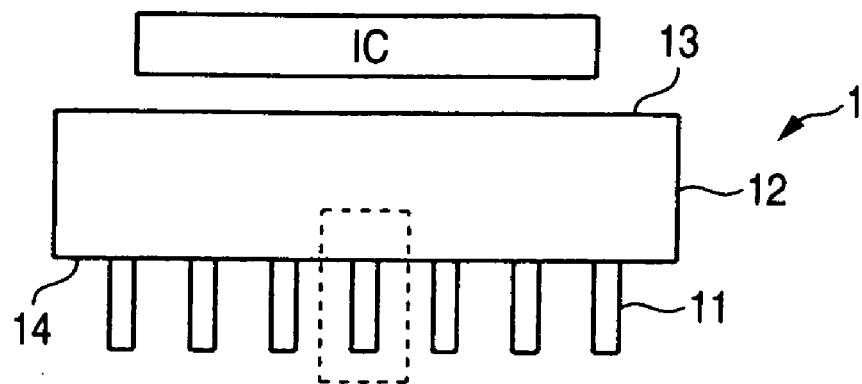
FIG. 1 is a side view of a circuit board 1 made of resin with pins according to the invention.
Figure 2:
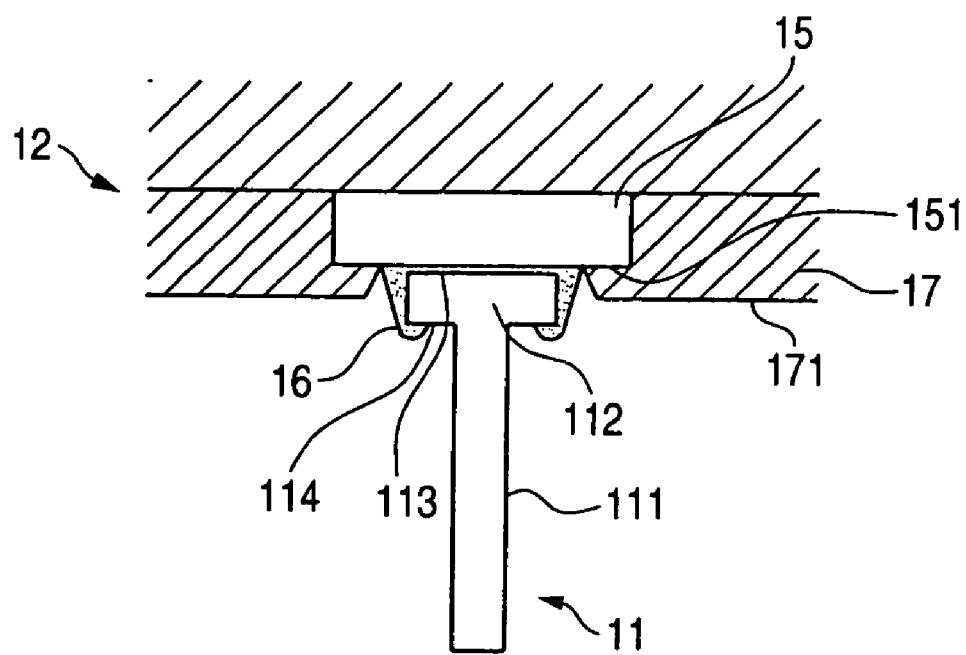
FIG. 2 is an enlarged view of FIG. 1.
Figure 3:
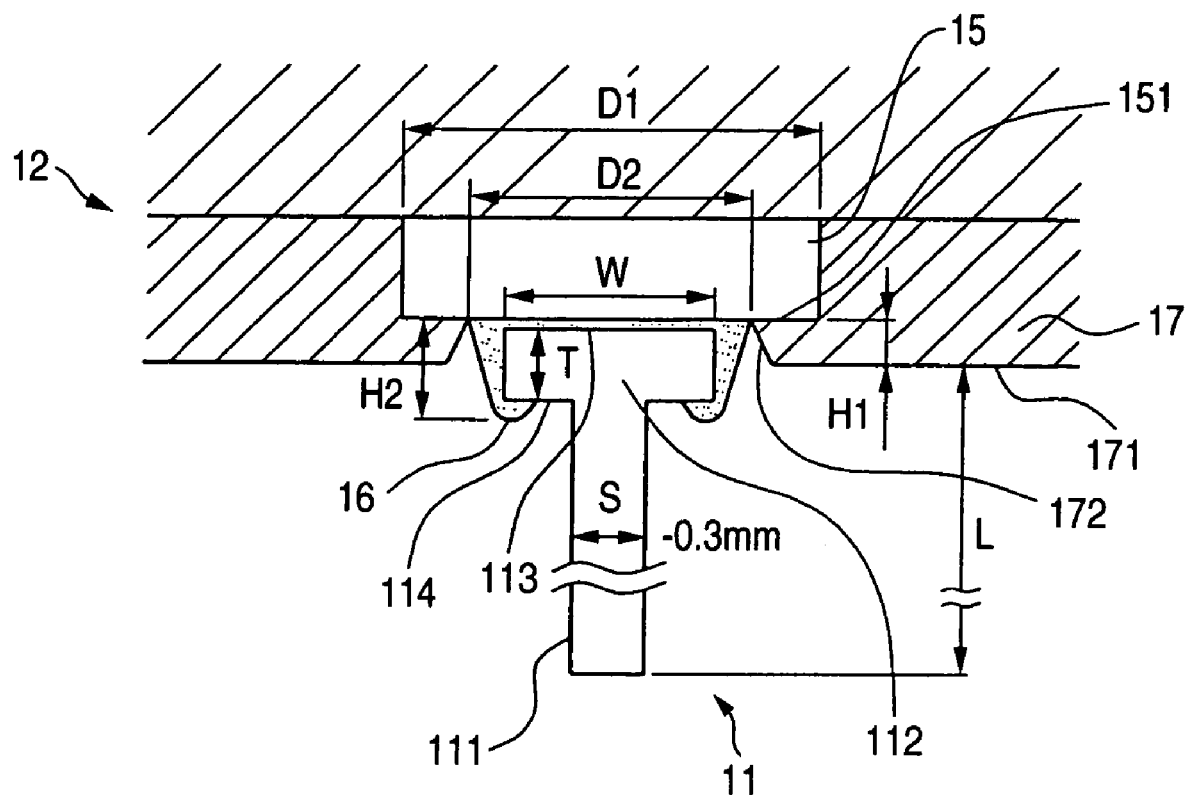
FIG. 3 is an enlarged view of FIG. 2.

Embodiments of implementation of the invention will be described in detail in connection with the attached drawings. FIG. 1 is a side view of a circuit board 1 made of resin with pins according to the invention. FIG. 2 is an enlarged sectional view of FIG. 1. FIG. 3 is an enlarged sectional view of FIG. 2. The circuit board 1 made of resin with pins is rectangular (50 mm long×50 mm wide×1 mm thick) as viewed on the plan view and is mainly composed of a resin board 12 including a plurality of resin insulating layers mainly composed of an epoxy resin and inner wiring layers made of copper laminated on each other on a core board (thickness: about 0.8 mm). The circuit board 1 made of resin with pins has a number of electrodes (not shown) for connecting semiconductor integrated circuit element IC's mounted on the upper main surface 13 thereof and bores (not shown) formed thereinside for connecting the inner wiring layers on one layer to another and the inner wiring layers to each other on one layer. The circuit board 1 made of resin with pins also has a number of conductor layers (copper) formed on the lower main surface 14 thereof connected to the bores. These conductor layers are, e.g., circular as viewed on the plan view. These conductor layers are each plated with a nickel or gold to form a pin bonding portion 15. These pin bonding portions 15 are formed apart from each other at an interval of about 1.3 mm.

The board 12 has a solder resist layer 17 made of an epoxy resin formed covering substantially the entire surface of the upper and lower main surfaces 13, 14 thereof. The height H1 of the solder resist layer 17 between the surface 171 of the solder resist layer 17 and the first main surface 151 of the pin bonding portion 15 is about 20 μm. However, the solder resist layer 17 in the present mode is formed in such an arrangement that it is opened with the periphery of the first main surface 151 of the pin bonding portion 15 covered at a predetermined width and the area of the first main surface 151 of the pin bonding portion 15 close to the center exposed concentrically. In the present embodiment, the length D1 of the pin bonding portion (conductor layer) is predetermined to be about 2.06 mm and the length D2 of the exposed area (opening of the solder resist layer 17, i.e., area which is not covered by the solder resist layer on the surface of the pin bonding portion) in the direction parallel to the main surface of the board, i.e., diameter of the soldering surface is predetermined to be about 1.03 mm.

On the other hand, the pin bonded to the board in the present embodiment is a nail-shaped flat pin made of Alloy 194 (CDA Alloy C19400 (conforming to ASTM B465)) comprising a round rod portion (diameter: about 0.30 mm) 111 having a circular section and a concentric circular large diameter portion 112 having a greater diameter than the rod portion formed on the upper end thereof. The large diameter portion 112 is disposed opposed and soldered with a proper amount of solder to the upper first main surface 151 of the pin bonding portion 15 concentrically with the first main surface 151 of the pin bonding portion 15 (The layer formed by soldering is referred to as "solder layer 16"). As the solder there is used a solder having a melting point higher than the soldering temperature of semiconductor integrated circuit element IC (e.g., Pb 82%/Sn 10%/Sb 8% or Sn 95% and Sb 5%).

When a Pb—Sn-based solder such as Pb82%/Sn10%/Sb8% is used, the solder layer 16 can deform to receive the stress on the pin 11 developed by the application of an unexpected excessive external force to the pin 11 because the solder contain much lead (Pb), which is soft, making it difficult for the circuit board 1 made of resin with pins to undergo damage due to the external force (aforementioned three forms of damage).

In the present embodiment, the ratio of the diameter of the large diameter portion to the rod portion (W/S) is predetermined to be from 2.33 to 2.67 (if the diameter S of the rod portion 111 is 0.3 mm, the diameter W of the large diameter portion 112 is 0.73 mm or 0.75 mm) supposing that the diameter of the rod portion 111 of the pin 11 is S and the diameter of the large diameter portion 112 of the pin 11 (length in the direction parallel to the main surface of the board) is W. The ratio of the thickness of the large diameter portion to the diameter of the rod portion (T/S) is predetermined to be from 0.40 to 0.54 (if the diameter S of the rod portion 111 is 0.3 mm, the thickness T of the large diameter portion 112 is 0.15 mm) supposing that the thickness of the large diameter portion 112 (length in the direction perpendicular to the main surface of the board) is T. The height L of the solder resist layer 17 from the surface 171 of the solder resist layer 17 to the forward end of the pin 11 is predetermined to be about 2.00 mm (e.g., 2.08 mm).

Further, the large diameter portion 112 of the pin and the pin bonding portion 15 are bonded to each other with a solder layer 16 interposed between the first main surface 151 of the pin bonding portion 15 and the upper surface of the large diameter portion 112 disposed opposed thereto without coming in direct contact with each other. The distance between the upper surface 113 of the large diameter portion and the first main surface 151 of the pin bonding portion is predetermined to be from about 10 μm to 30 μm. It is preferred that the large diameter portion 112 of the pin and the pin bonding portion 15 be not in direct contact with each other to secure enough area for attachment of solder. However, the invention is not limited to this arrangement. The large diameter portion 112 of the pin and the pin bonding portion 15 may be in direct contact with each other.

The height H2 from the first main surface 151 of the pin bonding portion 15 is predetermined to be not greater than 0.3 mm. In the case where the height H2 is not smaller than 0.3 mm, when the pin is inserted into the socket of the mother board, the socket is brought into contact with the solder layer 16, making it difficult for the circuit board to set on the mother board.

Figure 4A:
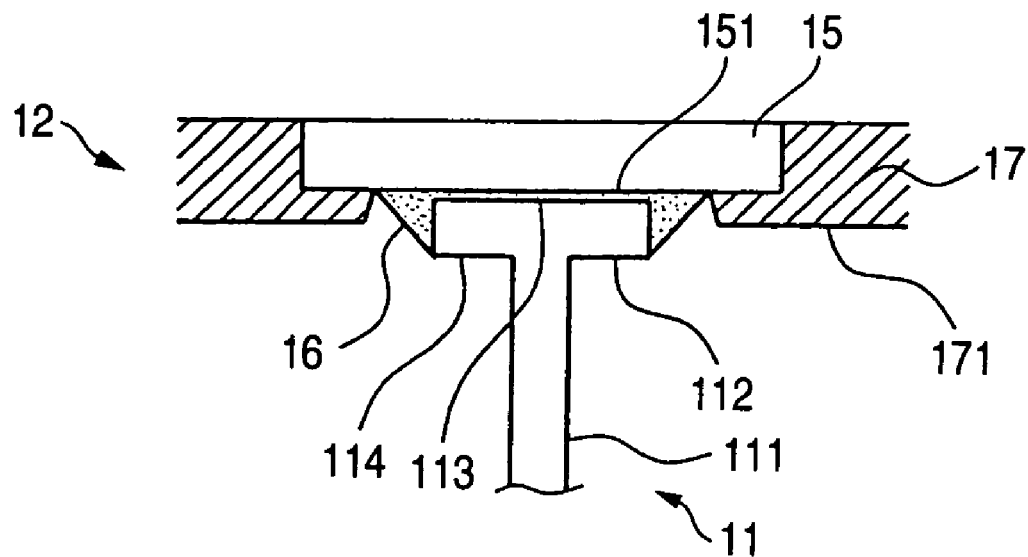
FIGS. 4A and 4B are diagrams illustrating an embodiment of solder layer.
Figure 4B:
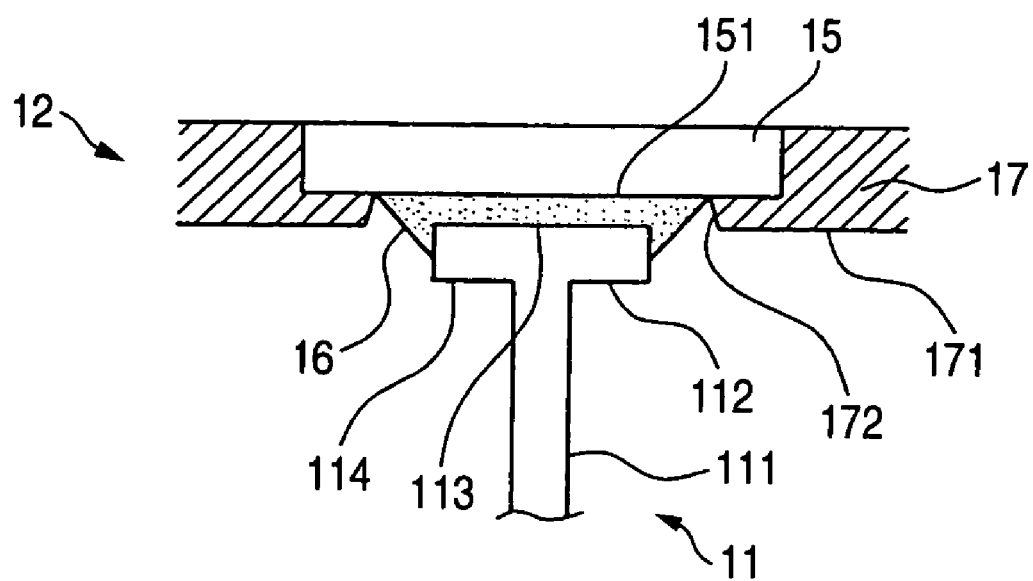

The height H2 of the solder layer 16 is predetermined to be higher than the position of the lower surface 114 of the large diameter portion 112 of the pin. In the present embodiment, solder is shown covering the lower surface 114 in the vicinity of the periphery thereof. However, solder may cover the entire lower surface 114 so far as the height H2 of the solder layer 16 is not greater than 0.3 mm. It is preferred that the height H2 of the solder layer 16 be higher than the position of the lower surface 114 of the large diameter portion 112 of the pin from the stand point of bonding strength. However, the invention is not limited to the aforementioned arrangement. The height H2 of the solder layer 16 may be lower than the position of the lower surface 114 of the large diameter portion 112 of the pin as shown in FIGS. 4A and 4B.

The solder layer 16 wets the large diameter portion 112 toward the first main surface 151 of the pin bonding portion 15. In the present embodiment, the diameter of the spread of wetting by the solder layer 16 is predetermined to be the same as the length D2 of the area of the pin bonding portion which is not covered by the solder resist layer in the direction parallel to the main surface of the board. However, the invention is not limited to the aforementioned arrangement. The diameter of the spread of wetting by the solder layer 16 may be smaller than D2. Alternatively, the solder layer 16 may partially cover the slanting surface 172 of the opening of the solder resist 17.

EXAMPLE

Figure 7:
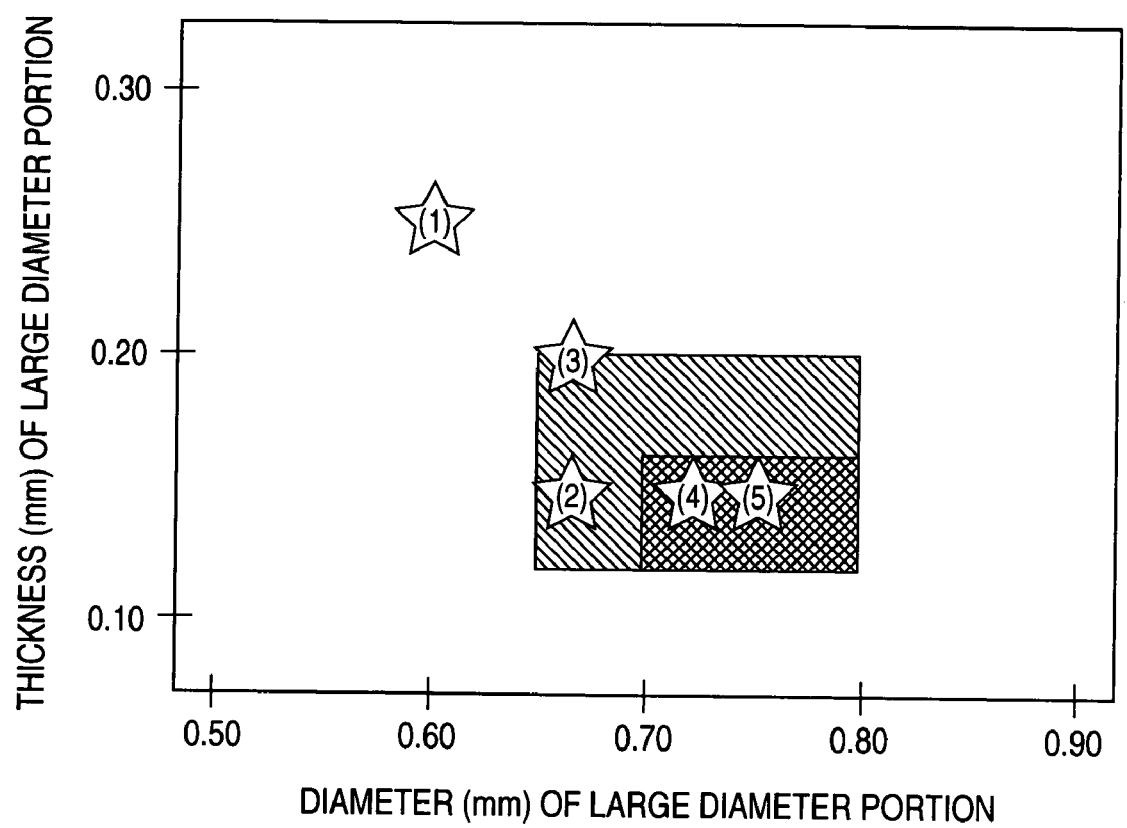
FIG. 7 is a diagram illustrating the diameter and thickness of the large diameter portion of pins of examples and comparative examples.

Specific examples of the circuit board made of resin with pins of the invention will be described hereinafter with comparative examples. The ratio (W/S) of the diameter of the large diameter portion to the rod portion of the pin and the ratio (T/S) of the thickness of the large diameter portion to the diameter of the rod portion of the pin of various samples are shown in FIG. 7. However, the diameter S of the rod portion of the pin of the various samples are 0.30 mm. The conditions will be itemized below.

(1) Sample No. 1 is a pin having a W/S ratio of 2.00 (diameter W of large diameter portion: 0.60 mm) and a T/S ratio of 0.83 (thickness T: 0.25 mm) (This sample is a comparative example which doesn't belong to any aspect).
(2) Sample No. 2 is a pin having a W/S ratio of 2.23 (diameter W of large diameter portion: 0.67 mm) and a T/S ratio of 0.50 (thickness T: 0.15 mm) (This sample is an inventive example which belongs to Aspects 1 and 2).
(3) Sample No. 3 is a pin having a W/S ratio of 2.23 (diameter W of large diameter portion: 0.67 mm) and a T/S ratio of 0.67 (thickness T: 0.20 mm) (This sample is an inventive example which belongs to Aspects 1 and 2).
(4) Sample No. 4 is a pin having a W/S ratio of 2.40 (diameter W of large diameter portion: 0.72 mm) and a T/S ratio of 0.50 (thickness T: 0.15 mm) (This sample is an inventive example which belongs to Aspects 1, 2 and 3).
(5) Sample No. 5 is a pin having a W/S ratio of 2.50 (diameter W of large diameter portion: 0.75 mm) and a T/S ratio of 0.50 (thickness T: 0.15 mm) (This sample is an inventive example which belongs to Aspects 1, 2 and 3).

Sample Nos. 1 to 5 pins are each then soldered to a circuit board made of resin comprising a pin bonding portion having a diameter of 1.03 mm in the direction parallel to the main surface of the area of the board uncovered by the solder resist layer in a large number to produce circuit boards made of resin with pins as Sample Nos. 1 to 5 (corresponding to the aforementioned number of pins). The circuit board made of resin with pins Nos. 1 to 5 are each then examined for bonding strength of 30 pins.

Figure 5:
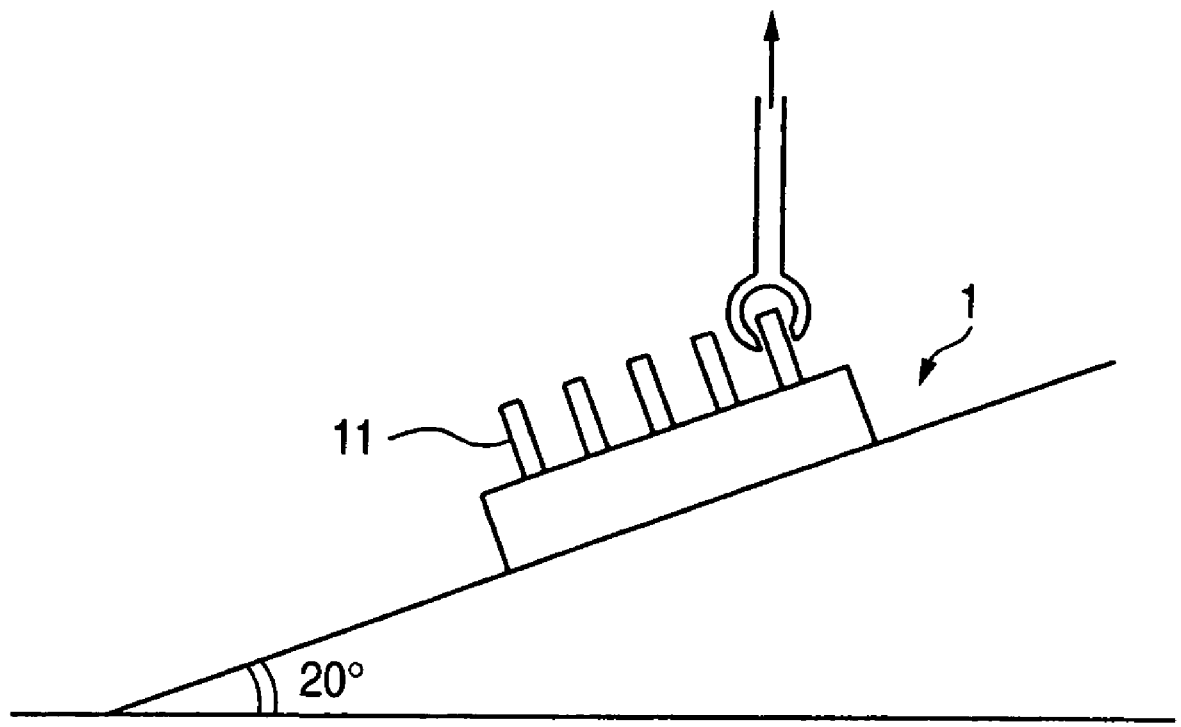
FIG. 5 is a diagram illustrating the outline of measurement of breaking load.
Figure 8:
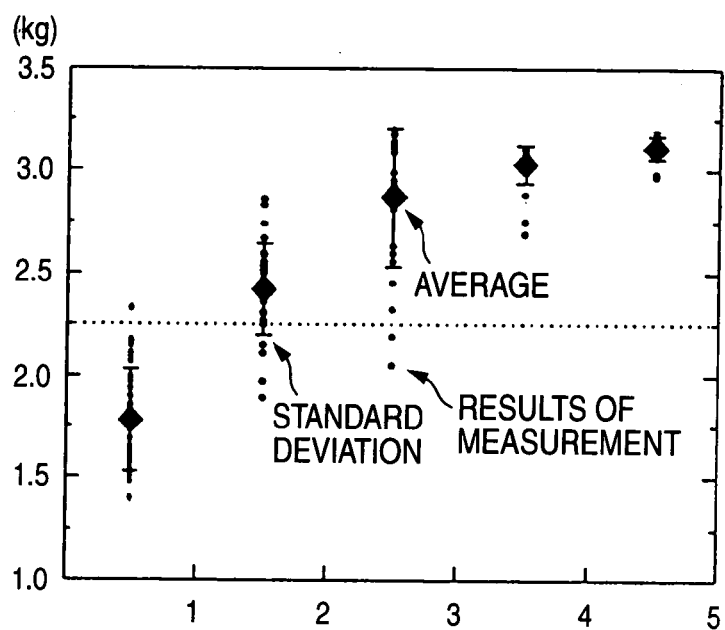
FIG. 8 is a diagram illustrating the results of measurement of pin strength (bonding strength)

The bonding strength is the breaking load (kg) of the circuit board made of resin with pins measured when the pin is pulled in the direction of 20 degrees from the axial direction as shown in FIG. 5. The measurement is conducted 30 times for each of Sample Nos. 1 to 5. FIG. 8 shows the results of measurement and the average and standard deviation of the results of measurement. Table 1 shows the average and standard deviation of the results of measurement. In the inventive examples, the criterion of judgment of bonding strength is defined to be not smaller than 2.25 kg as calculated in terms of breaking load.

TABLE 1

(the average and standard deviation of the results of measurement of pin strength (bonding strength))

| Sample No. | Average value (kg) | Standard deviation |
|---|---|---|
| 1 | 1.78 | 0.250 |
| 2 | 2.42 | 0.227 |
| 3 | 2.87 | 0.335 |
| 4 | 3.03 | 0.093 |
| 5 | 3.11 | 0.058 |

As shown in FIG. 8, Sample No. 1, which is a comparative example, exhibits an average bonding strength falling below the criterion of judgment, which is 2.25 kg. On the contrary, Sample Nos. 2 to 5, which are inventive examples, each exhibit an average bonding strength exceeding 2.25 kg. It is thus made obvious that the samples of circuit board made of resin having pins comprising a large diameter portion having a diameter and a thickness falling within the range defined herein exhibit a preferred bonding strength as compared with the comparative examples. However, some of Sample Nos. 2 and 3 exhibited a measured average bonding strength falling below 2.25 kg. Further, Sample Nos. 2 and 3 tend to show a great standard deviation of bonding strength as compared with Sample Nos. 4 and 5.

Figure 6A:
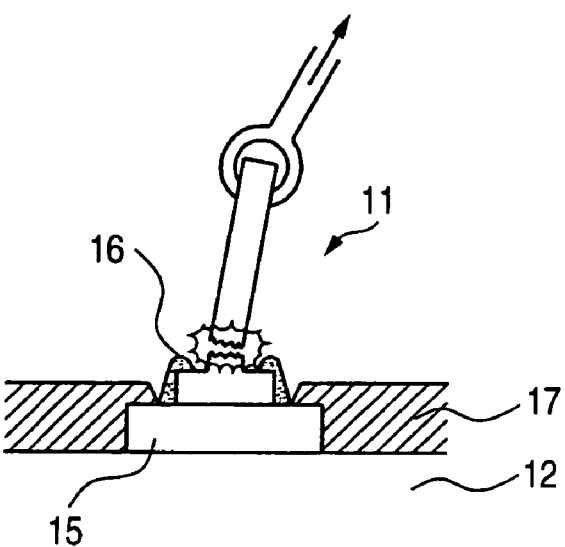
FIGS. 6A to 6C are diagrams illustrating forms of damage of a circuit board made of resin with pins.
Figure 6B:
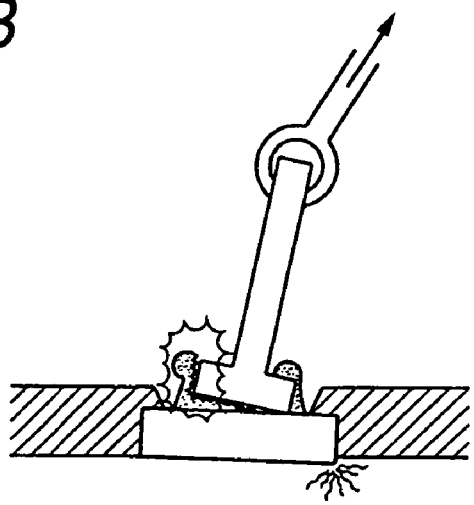
Figure 6C:
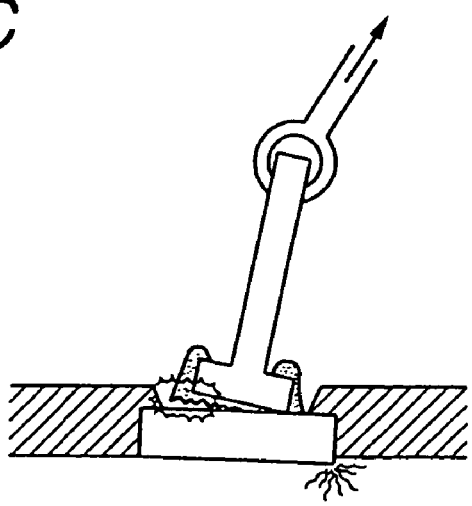
Figure 9:
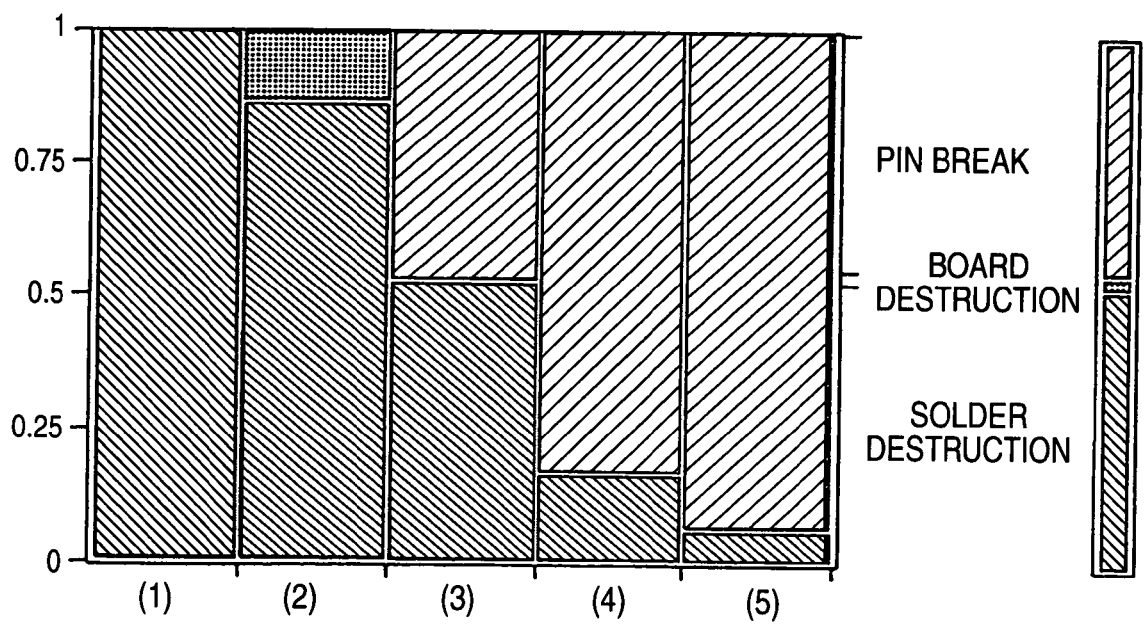
FIG. 9 is a diagram illustrating the proportion of destruction modes.

As previously mentioned, forms of damage of the circuit board made of resin with pins upon the application of an external force can be roughly divided into three forms as shown in FIGS. 6A to 6C. Among these forms of damage, damage, if any, preferably occurs in the pin alone. During the aforementioned measurement of bonding strength, when the circuit board made of resin with pins is broken, observation is made for how it is broken. As can be seen in the results of FIG. 9, Sample Nos. 4 and 5, which belong to Aspect 3, are broken only at the pins in a proportion of 80% or more and 90% or more, respectively. On the contrary, Sample No. 1, which is a comparative example, is broken at the solder layer in a proportion of 100%. Even Sample No. 2, which doesn't belong to Aspect 3, is mostly broken at the solder layer. Some of Sample No. 3 circuit boards are broken at the pins. However, Sample No. 3 is broken at the solder layer in a proportion of not smaller than 50%. It is thus made obvious that most of the circuit boards made of resin having pins comprising a large diameter portion having a diameter and a thickness falling within the range defined in Aspect 3 of the invention undergo breakage only at the pins, which is a desirable form of damage, during destruction as compared with the other samples. Further, as shown in FIG. 8 and Table 1, as compared with Sample Nos. 1 to 3, Sample Nos. 4 and 5 showed a great average measured value of breaking load as well as a standard deviation of breaking load as small as from about 60% to 80% of that of Sample Nos. 1 to 3, demonstrating that those which undergo breakage only at pins show a small dispersion of breaking load as compared with those which undergo other forms of damage and thus are also advantageous in that stable products can be supplied.

The method of bonding the aforementioned pin 11 to the board will be described in detail hereinafter. However, the method of bonding the pin 11 to the board is the same as the related art method of producing a circuit board made of resin with pins except that the pin 11 to be bonded comprises a large diameter portion 112 having a diameter Wand a thickness T having a predetermined relationship defined in the invention.

The inner wiring layer in the circuit board 12 to which the pins are not yet bonded is formed by a subtractive method, semi-additive method or full-additive method involving silver plating. The formation of the resin insulating layer is accomplished by laminating a resin which is previously formed into a film on the surface of a core board or underlayer board or spreading a liquid resin over the board using a roll coater or the like. The formation of bore in the resin insulating layer is accomplished by boring using laser beam if the material is a light-insensitive resin or by boring using photolithography if the material is a light-sensitive resin.

Thereafter, photolithography is employed for example to spread a light-sensitive solder resist layer over the board. The light-sensitive solder resist layer is exposed to light through a mask pattern which is formed open at the center of the pin bonding portion 15, and then developed and cured to form a solder resist layer 17. Subsequently, the board is plated with nickel and gold on the exposed metal area such as pin bonding portion 15. A solder paste is then screen-printed on the pin bonding portion 15 in the aforementioned amount.

Separately, a predetermined fixture (not shown) having a number of small holes allowing the insertion of pins 11 provided therein opposed to the position of the pin bonding portions 15 on the board 12 is prepared. Pins 11 which are plated with nickel and gold are inserted in the respective small holes with the large diameter portion 112 positioned upside. By predetermining the thickness of the gold deposit on the surface of the pin 11 to be not smaller than 0.04 μm (0.3 μm in the present embodiment), the reliability in oxidation resistance or connection to socket, etc. can be enhanced. Subsequently, the board 12 is positioned and placed on the tabular fixture having the pins received therein so that the bonding surface 113 of the pins 11 come in contact with the pin bonding portions 112. The solder paste is then heated and melted. In this manner, the number of pins 11 are soldered to the pin bonding portions 112 at once. Thus, a circuit board of the invention is produced.

The large diameter portion 112 of the pin 11 doesn't necessarily needs to be formed by the same material as the main body of the pin but maybe formed by refluxing (fusing) a solder having a melting point which doesn't melt at the soldering temperature of the pin. The large diameter portion 112 of the pin in the present embodiment can be formed by pressing one end of an axis material (wire material) in the axial direction using a flat-shaped mold.

As the solder for soldering the pin 11 there maybe selected a proper one from those which don't melt at the soldering temperature of electronic parts such as IC depending on the material of the circuit board used. For circuit boards made of resin for example, Pb—Sn-based solders (e.g., 82Pb-10Sn-8Sb solder, 27Pb-73Sn eutectic solder, 50Pb-50Sn solder), Sn—Sb-based solders (e.g., 95Sn-5Sb solder), Sn—Ag-based solders (e.g., 96.5Sn-3.5Ag-based solder), etc. may be used. Among these solders, Sn—Sb-based solders don't well wet pins having a gold deposit on the surface thereof and thus are advantageous in that they can be prevented from running toward the pins during the fixing of the pins to the board.

The flat surface of the pin bonding portion 15 and the large diameter portion 112 of the pin 11 are normally circular as viewed in the axial length in the present embodiment, but the invention is not limited thereto. It is more desirable that the surface of the large diameter portion 112 which forms a soldering surface be roughened to increase the bonding area.

In the aforementioned description, the circuit board made of resin with pins is embodied in a PGA-type circuit board made of an epoxy resin. However, it goes without saying that the board of the invention can be embodied regardless of the material of the board such as polyimide resin, BT resin and PPE resin. Further, the invention can be applied regardless of which the board has a single layer structure or multi-layer structure. Moreover, the invention is not limited to PGA type but can be widely embodied in circuit boards on which flat pins are soldered at pin bonding portions. Thus, the invention is not limited to the aforementioned embodiments but can be embodied in properly modified designs without departing from the spirit and scope thereof.

As made obvious from the aforementioned description, the circuit board made of resin with pins of the invention comprises pins having a large diameter portion having a diameter and a thickness which meet predetermined requirements. Therefore, a sufficient bonding strength of the pin with the pin bonding portion can be obtained. Further, when an external force acts on the pins, only the pins undergo damage, making it difficult for the solder portion and the board to destroy. Accordingly, the invention can provide a circuit board made of resin with pins which can be provided with a high bonding strength and can be easily repaired even if damaged. Moreover, the circuit board of the invention is made of a resin that requires the use of a solder having a low melting point for soldering the pins. Therefore, the bonding strength of the pins tend to be low. However, in the invention, even if such a solder is used, it is assured that the bonding strength of the pins can be enhanced.

What is claimed is:

1. A circuit board made of resin with pins, comprising:
flat pins each including:
a rod portion having a diameter of not greater than 0.35 mm, and
a concentric tabular large diameter portion having a larger diameter than that of the rod portion formed on one end of the rod portion,
the flat pins each being soldered to a pin bonding portion provided on a main surface of the board at the large diameter portion, wherein
the ratio (W/S) of the diameter of the large diameter portion to the rod portion is from not smaller than 2.16 to not greater than 2.67, if the diameter of the rod portion and the large diameter portion of the flat pin are S and W, respectively,
wherein
the formed thickness of a solder layer is adjusted to be not greater than 0.30 mm along the vertical direction from the first main surface of the pin bonding portion toward the flat pin.

2. The circuit board made of resin with pins as defined in claim 1, wherein
the flat pins are each made of a metal material containing at least copper.

3. The circuit board made of resin with pins as defined in claim 1, wherein
a top potion of the concentric tabular large diameter portion is exposed from the a solder layer.

4. A circuit board made of resin with pins, comprising:
flat pins each including:
a rod portion having a diameter of not greater than 0.35 mm, and
a concentric tabular large diameter portion having a larger diameter than that of the rod portion formed on one end of the rod portion,
the flat pins each being soldered to a pin bonding portion provided on a main surface of the board at the large diameter portion, wherein
the ratio (W/S) of the diameter of the large diameter portion to the rod portion is from not smaller than 2.16 to not greater than 2.67, if the diameter of the rod portion and the large diameter portion of the flat pin are S and W, respectively,
wherein
the ratio (T/S) of the thickness of the large diameter portion to the diameter of the rod portion is from not smaller than 0.40 to not greater than 0.67, if the thickness of the large diameter portion is T.

5. The circuit board made of resin with pins as defined in claim 4, wherein
the ratio (W/S) of the diameter of the large diameter portion to the rod portion is from not smaller than 2.33 to not greater than 2.67, and
the ratio (T/S) of the thickness of the large diameter portion to the diameter of the rod portion is from not smaller than 0.40 to not greater than 0.54.

* * * * *